United States Patent [19]
Duesman et al.

[11] Patent Number: 5,245,577
[45] Date of Patent: Sep. 14, 1993

[54] INTEGRATED CIRCUIT TWO-CYCLE TEST MODE ACTIVATION CIRCUIT

[75] Inventors: Kevin Duesman; Todd Merritt, both of Boise, Id.

[73] Assignee: Micron Technology, Inc., Boise, Iowa

[21] Appl. No.: 619,763

[22] Filed: Nov. 6, 1990

[51] Int. Cl.$^5$ .................. G11C 7/00; G11C 29/00
[52] U.S. Cl. .................... 365/201; 365/189.05; 371/21.1
[58] Field of Search .............. 365/201, 233, 189.02, 365/189.01, 189.05; 371/21.1

[56] References Cited
U.S. PATENT DOCUMENTS

4,860,259 8/1989 Tobita .................. 365/201

Primary Examiner—Joseph A. Popek

[57] ABSTRACT

In an integrated circuit memory chip an improved test mode activation circuit that utilizes a two-cycle voltage level input in conjunction with a first and second voltage pulse. The first and second voltage level inputs are different from the normal power supply voltage level and are compared with each other to see that a significant voltage transition has occurred and, if so, then a test mode output signal is initiated.

18 Claims, 7 Drawing Sheets

TRUTH TABLE

FIGURE 3A

TOTAL CKT

| N-SEC | VDD | MRESET | WCBR | COUNTA | COUNTB | VCOMP | SAOUT | TEST MODE | ACTION |
|---|---|---|---|---|---|---|---|---|---|
| 30 | 1 | 0 | 1 | 0 | 0 | 0 | 0 | 0 | RESET |
| 100 | 1 | 1 | 1 | 0 | 0 | 0 | 0 | 0 | |
| 170 | 1 | 1 | 0 | 0 | 0 | 0 | 0 | 0 | WCBR DETECTED |
| 200 | 1 | 1 | 1 | 1 | 0 | 1 | 0 | 0 | VCOMP IS STORED |
| 300 | 1 | 1 | 1 | 1 | 0 | 1 | 1 | 0 | VDD IS RAMPED DOWN, SAOUT DETECTS IT |
| 340 | 1 | 1 | 0 | 1 | 0 | 1 | 1 | 0 | SECOND WCBR PULSE |
| 400 | 1 | 1 | 1 | 0 | 1 | 1 | 1 | 1 | TEST MODE IS LATCHED |
| 500 | 1 | 0 | 1 | 0 | 0 | 0 | 0 | 0 | RESET |

TRUTH TABLE

FIGURE 3B

N = NON-CONDUCTING
C = CONDUCTING

WCBR COUNTA

| N-SEC | WCBR | $\overline{\text{WCBR}}$ | 104 | 106 | 108 | MUX1 | MUX2 | COUNTA | $\overline{\text{COUNTA}}$ | ACTION |
|---|---|---|---|---|---|---|---|---|---|---|
| 30 | 1 | 0 | 0 | 1 | 0 | N | C | 0 | 1 | COUNTA IS RESET |
| 100 | 1 | 0 | 0 | 1 | 0 | N | C | 0 | 1 | |
| 170 | 0 | 1 | 1 | 0 | 1 | C | N | 0 | 1 | WCBR GOES LOW AND PASSES $\overline{\text{COUNTA}}$ TO NODE 104 |
| 200 | 1 | 0 | 1 | 0 | 1 | N | C | 1 | 0 | WCBR RETURNS HIGH AND PASSES 108 TO COUNTA |
| 300 | 1 | 0 | 1 | 0 | 1 | N | C | 1 | 0 | |
| 340 | 0 | 1 | 0 | 1 | 0 | C | N | 1 | 0 | WCBR GOES LOW AND PASSES $\overline{\text{COUNTA}}$ TO NODE 104 |
| 400 | 1 | 0 | 0 | 1 | 0 | N | C | 0 | 1 | WCBR RETURNS HIGH AND PASSES 106 TO COUNTA |
| 500 | 1 | 0 | 0 | 1 | 0 | N | C | 0 | 1 | RESET |

TRUTH TABLE

FIGURE 3C

WCBR COUNTB

| N-SEC | WCBR | COUNTA | 110 | 112 | 114 | MUX1 | MUX2 | COUNTB | COUNTB | ACTION |
|---|---|---|---|---|---|---|---|---|---|---|
| 30 | 0 | 1 | 0 | 1 | 0 | N | C | 0 | 1 | RESET |
| 100 | 0 | 1 | 0 | 1 | 0 | N | C | 0 | 1 | |
| 170 | 0 | 1 | 0 | 1 | 0 | N | C | 0 | 1 | |
| 200 | 1 | 0 | 1 | 0 | 1 | C | N | 1 | 1 | COUNTA GOES HIGH PASSING COUNTA TO NODE 110 |
| 300 | 1 | 0 | 1 | 0 | 1 | C | N | 1 | 1 | |
| 340 | 1 | 0 | 1 | 0 | 1 | C | N | 1 | 1 | |
| 400 | 0 | 1 | 0 | 1 | 0 | N | C | 0 | 0 | COUNTA GOES LOW PASSING 114 TO COUNTB |
| 500 | 0 | 1 | 0 | 1 | 0 | N | C | 0 | 1 | RESET |

TRUTH TABLE

FIGURE 3D

STORE CKT

| N-SEC | CTA | 120 | 122 | 124 | 128 | 130 | 132 | 134 | VCOMP | MRES | ACTION |
|---|---|---|---|---|---|---|---|---|---|---|---|
| 30 | 0 | 1 | 0 | 1 | 0 | 0 | 1 | 0 | 0 | 0 | RESET |
| 100 | 0 | 1 | 0 | 1 | 0 | 0 | 0 | 0 | 0 | 1 | |
| 170 | 0 | 1 | 0 | 1 | 0 | 0 | 0 | 0 | 0 | 1 | |
| 200 | 1 | 0 | 1 | 0 | 0-1 | 1-0 | 0 | 1 | 1 | 1 | VCOMP STORED IN C1,C2 |
| 300 | 1 | 0 | 1 | 0 | 1 | 0 | 0 | 1 | 1 | 1 | |
| 340 | 1 | 0 | 1 | 0 | 1 | 0 | 0 | 1 | 1 | 1 | |
| 400 | 0 | 1 | 1 | 0 | 1 | 0 | 0 | 1 | 0 | 1 | |
| 500 | 0 | 1 | 0 | 1 | 0 | 0 | 1 | 0 | 0 | 0 | RESET |

TRUTH TABLE

FIGURE 3E

SENSE P LATCH

| N-SEC | VCOMP | SAOUT | COUNTB | 140 | 142 | TEST MODE | MRE | ACTION |
|---|---|---|---|---|---|---|---|---|
| 30 | 0 | 0 | 0 | 1 | 1 | 0 | 0 | RESET |
| 100 | 0 | 0 | 0 | 1 | 1 | 0 | 1 | |
| 170 | 0 | 0 | 0 | 1 | 1 | 0 | 1 | |
| 200 | 1 | 0 | 0 | 1 | 1 | 0 | 1 | |
| 300 | 1 | 1 | 0 | 1 | 1 | 0 | 1 | |
| 340 | 1 | 1 | 0 | 1 | 1 | 0 | 1 | |
| 400 | 1 | 1 | 1 | 0 | 0 | 1 | 1 | TEST MODE IS LATCHED |
| 500 | 0 | 0 | 0 | 1 | 1 | 0 | 0 | RESET |

INTEGRATED CIRCUIT TWO-CYCLE TEST MODE ACTIVATION CIRCUIT

FIELD OF THE INVENTION

This invention relates to a circuit that activates a test mode signal within an integrated circuit (IC) device in response to a first higher external input voltage signal, followed by a second, lower input voltage signal, both in conjunction with an internally generated pulse. The circuit test mode is terminated by another reset signal. The circuit provides for exclusive testing by the manufacturer and it would be difficult for an IC user to inadvertently activate this test mode.

BACKGROUND OF THE INVENTION

As memory chips become larger, the testing time required to verify that data is being correctly stored and read has increased, often at an exponentially growing rate. In dynamic wafer large-scale integration, wherein a relatively large number of memory chips on a single wafer are tested and then interconnected to provide an operative device when power is first applied (power up), the test time is particularly important.

Memory devices such as random access memories (RAMs) are commonly tested by applying signals of known logic levels to the memory cells and reading the signals out of the cells individually to determine whether they are of the proper level. In one commonly used test, a signal having a logic level of either one or zero is applied to one of the memory cells and signals of the opposite logic level are applied to the remaining cells. The signals are then read out of the cells individually and tested for the correct logic levels. This test must be repeated for each of the cells in the device, and the entire procedure is repeated with signals of the opposite levels. With a square array of n memory cells of a single bit, this test requires about $2 \times (3n+n^2)$ memory cycles. For example, a 4096 bit RAM operating at a 1 microsecond rate would require a test time of over 30 seconds, and a 16,384 bit memory would take over 8 minutes to test. Thus, it can be seen that the test time for a single RAM chip can be excessive; and, when several hundred such chips on a wafer are tested sequentially, the test time is considerable.

With the introduction of larger scale chips, i.e. 4-meg bit memory cells, the test time becomes even more critical. The current industry standard is to set the test mode by doing a WCBR (CAS before RAS with WE low) and use the address inputs to determine into which test mode to go, and to RESET the test mode by doing either a CBR (CAS before RAS) or a RAS-only cycle. CAS is a COLUMN ADDRESS SELECT signal, and RAS is a ROW ADDRESS SELECT signal.

The 4-meg Dynamic Random Access Memory (DRAM) generation typically uses a WCBR (CAS before RAS with WE low) to put the device into test mode. This can create a problem since a less sophisticated device user might operate the device in this fashion even though it is an invalid timing scheme. This accidental misuse inadvertently activates the test mode when it is not desired.

In conjunction with the above signals, the activation of the test mode within an IC memory chip is done by the use of a supervoltage, at the normal power supply VDD, where the voltage pulse used is about 11 volts, in lieu of the normal 5 volts. The use of this supervoltage pulse is undesirable because stacked diodes must be used and they are very temperature dependent. Additionally, as IC chip gate oxides get thinner, the higher voltages create an oxide insulation breakdown risk reducing reliability.

It is thus an object of this invention to provide a test mode activation circuit that avoids the potential problem of inadvertent activation of the test mode by the IC chip user. It is a further object of this invention to eliminate the need for a supervoltage power supply pulse circuit.

SUMMARY OF THE INVENTION

In accordance with the present invention, a test mode activation and reset circuit is provided for testing DRAM integrated circuit chips. The circuit and apparatus generally comprises: two binary ripple (pulse) counters, a power supply voltage storage circuit, a voltage sensing circuit, and a test mode latch circuit. The counters tell the circuit which WRITE CAS BEFORE RAS (WCBR) pulse has occurred, i.e., a first or second pulse. The storage circuit stores a ratio of external power supply voltage VCOMP on a capacitor during the first WCBR pulse. In this case, that ratio is ⅝ VDD, or 5 V, where VDD is an external power supply voltage. The sense circuit detects whether or not VDD drops below VCOMP, the stored voltage, when the second WCBR occurs. If the sense circuit is in a high state, the test mode output will be latched until a reset signal resets all circuits.

VDD is at a higher level, i.e., 8 volts, during the first WCBR pulse and at a lower level, 4 volts, during a second WCBR pulse. These voltages are chosen since they are not in the normal range of power supply voltages, i.e., 4.5 to 5.5 volts, and, therefore, are unique so as to avoid inadvertent test mode activation.

The test mode in this circuit can be activated by the method including the steps of:
resetting all circuits by activating a pulse at each circuit;
initiating a first pulse at the first counter while a power supply signal is at a high level;
storing a ratio of the power supply voltage in a storage circuit;
reducing the power supply to a lower voltage;
initiating a second pulse at the first and second counters;
comparing the ratio of the power supply voltage with the second, reduced, lower power supply voltage;
sensing a difference in the ratio and reduced voltage;
latching an output test mode voltage signal to initiate the test mode; and, finally,
resetting the circuits on completion of the test mode.

The circuit of the invention initiates the test mode by a discrete combination of pulses and voltages thereby eliminating inadvertent activation of the test mode by accident.

Other objects, advantages, and capabilities of the present invention will become more apparent as the description proceeds.

DETAILED DESCRIPTION OF THE INVENTION

Figure 1:
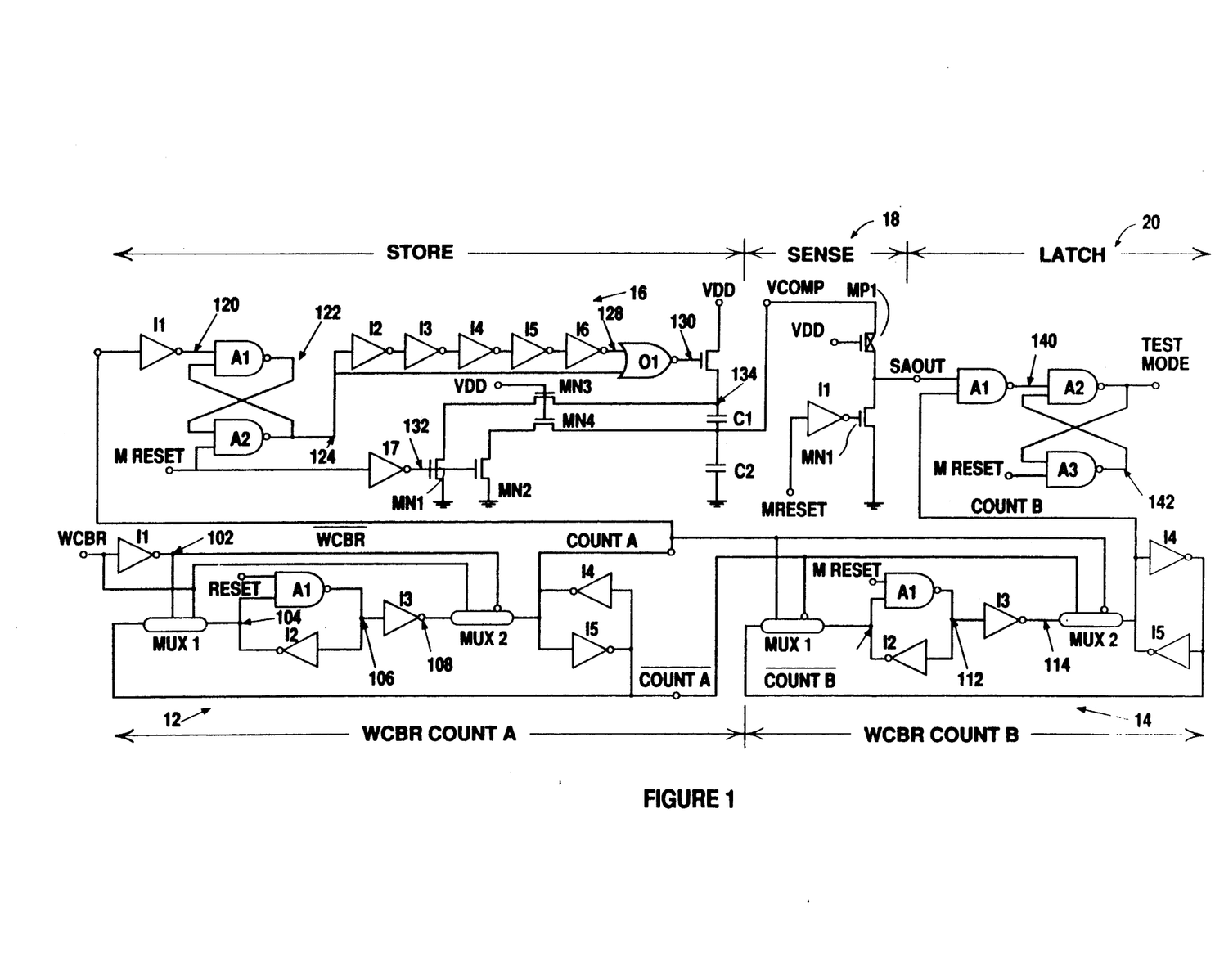
FIG. 1 is an electrical schematic and logic diagram of the present invention.
Figure 2:
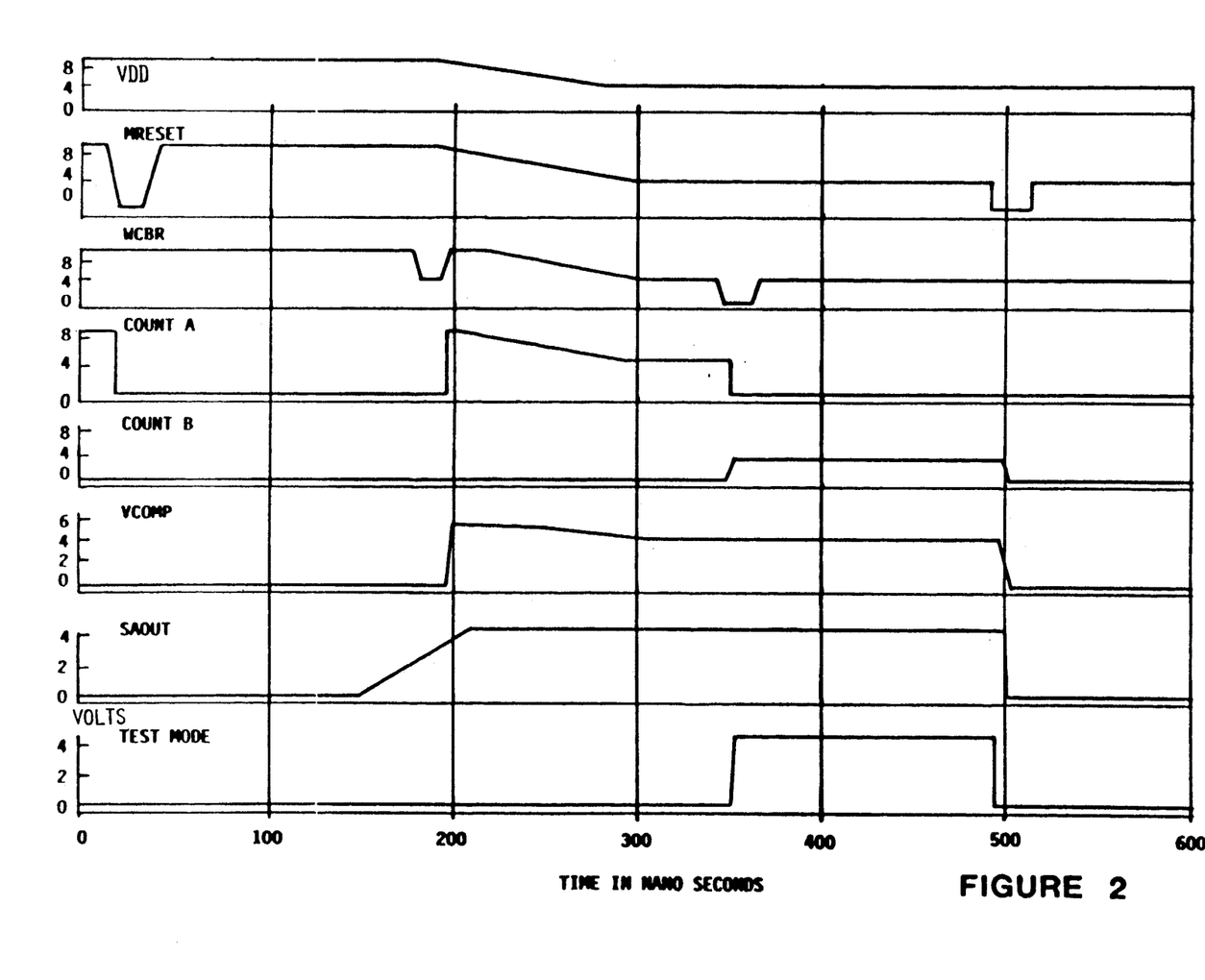
FIG. 2 is a computer simulation of voltage signals versus time within the present invention.

An integrated circuit (IC) two-cycle test mode activation circuit is illustrated in FIGS. 1 and 2. The circuit generally stated includes a first and second binary pulse counter means, a voltage store means, a voltage sensing means, and a test mode latch means that is activated by sequential pulses and specific voltage levels so as to activate a test mode until reset.

Referring now to FIG. 1, the test mode activation circuit is shown consisting of binary counters WCBR COUNTA 12 and WCBR COUNTB 14, a store means 16, a sense means 18, and test mode latch means 20.

Input signals WCBR at 22 and MRESET 24 are internally generated within an external IC chip not shown and VDD is an external voltage power supply voltage.

The output TEST MODE 30 connects to various test mode latch circuits within the IC chip and at a level 1 output (high), signals that the chip is in a test mode. As an example, the TEST MODE output signal in conjunction with external address signals can input to latch circuits for an ENABLE INTERNAL COMPARE mode or a DISABLE REGULATOR mode. The test mode is used by the manufacturers exclusively to test the memory cells or specific periphery modes of operation within the IC device, prior to delivery to the user.

The circuit components and logic circuits will be described by referring to FIG. 1 and, more specifically, referring to the WCBR COUNTA means 12. Input signal WCBR (pulse) is applied at invertor I1 and also to multiplexers (on-off switches) MUX1 and MUX2 (pass through devices). Input to the NAND gate A1 has an output 106 to two invertors I2 and I3. I3 provides an input 108 to MUX2. The signal from MUX2, COUNTA also is an input to invertor I5 giving an output signal $\overline{\text{COUNTA}}$ which also inputs to I4 and MUX1.

Referring now to WCBR COUNTB means 14, the inputs COUNTA and $\overline{\text{COUNTA}}$ go to MUX1 and MUX2 (similar pass through devices) and a signal at 110 from MUX1 provides input to NAND gate A1 having output 112 to invertors I2 and I3. Output from I3 at 114 is an input to MUX2 which in turn has output COUNTB connecting to latch means 20 and an invertor I4. An output from invertor I4 provides $\overline{\text{COUNTB}}$ signal to MUX1 input.

Store means 16 has an input COUNTA to invertor I1. Output 120 from I1 is an input to NAND gate latches A1 and A2. The latch output goes to serially connected delay circuit invertors I2 through I6 and a NOR gate O1. A STORE reset circuit consists of invertor I7 and MOS FET devices MN1, MN2, MN3, and MN4, which connect across capacitors C1 and C2. C2 stores the ratio voltage VCOMP, i.e., 5 volts. Output from NOR gate O1 is an input to the gate of MOS FET device MN5.

Referring to sense means 18, VCOMP (the stored 5-volt signal) gives input to MOS FET MP1 which compares VCOMP with VDD having an output SAOUT, if VDD is less than 5 volts.

Latch mean 20 has inputs from COUNTB and SAOUT to NAND gate A1. The output 140 from A1 gate is input to latch NAND gates A2 and A3, and a final output TEST MODE. Each of the above circuits also has an MRESET input.

In addition to these circuits, there are circuits to detect WCBR pulses and CBR or RAS only (for MRESET), which are not shown. Also, multiple test mode circuits can be enabled as they are now by current industry standard devices, by means of external addresses. The reset pulse in this circuit is set so that the circuit is reset during "power up" (first time power is applied). In IC DRAM devices, this power-up can be signalled by an N-well potential within the P-channel MOS transistor.

Operation of the circuit will be described by referring to the diagram of FIG. 1, the time traces of FIG. 2, and the Truth Tables in FIG. 3. The Truth Tables of FIG. 3 indicate a "high" state of "1", a "low" state of "0", and a multiplexer (MUX) state of conducting (C) or non-conducting (N) between the input and output terminals.

Figure 3A:
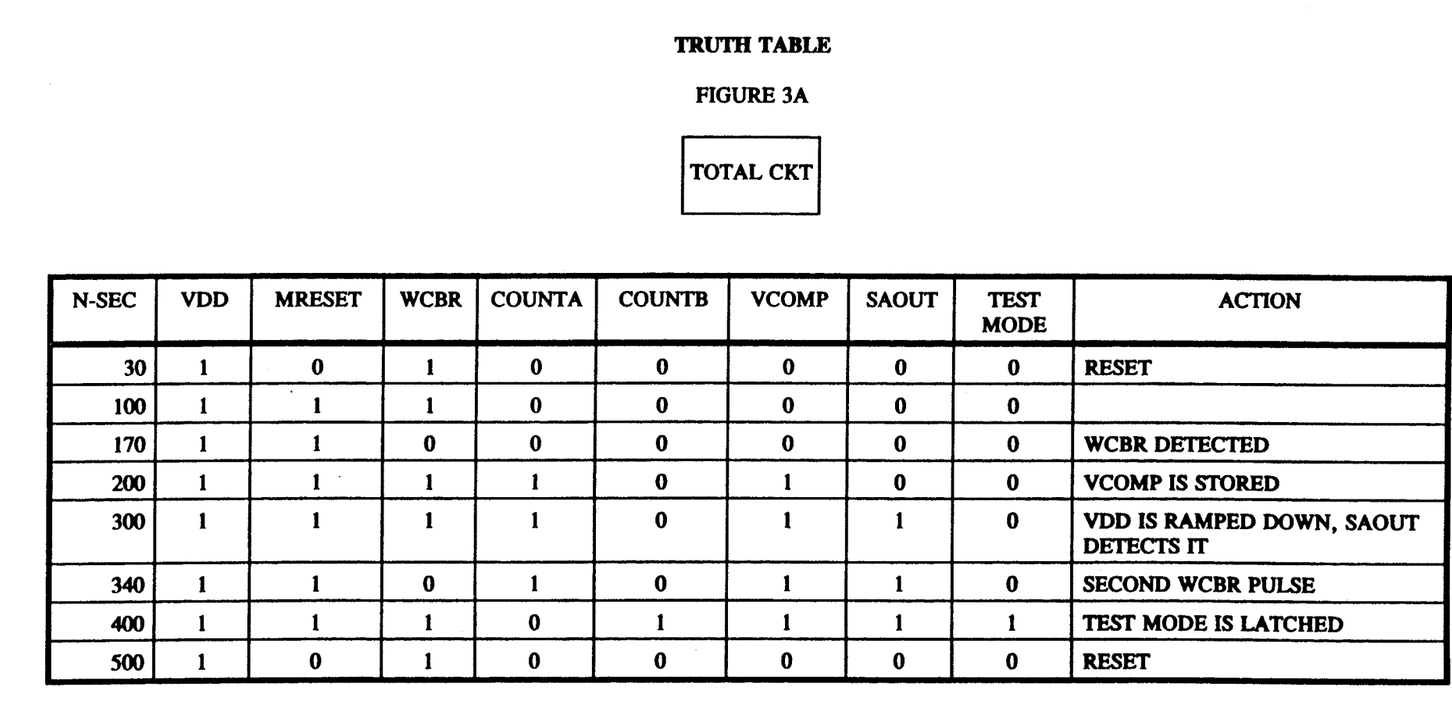
FIGS. 3A through 3E are Truth Tables for the components of the invention.

Referring to FIG. 2 and TOTAL CIRCUIT TRUTH TABLE, FIG. 3A, the cycle commences at 20 nanoseconds (ns) where low pulse MRESET initializes all circuits. At 170 ns, a low WCBR is detected causing a high at COUNTA and storage of about 5 volts in VCOMP. At 200 ns, external VDD starts a ramp down from 8 volts to 4 volts, the 4 volts occurring at 300 ns. (Although the VDD ramp down in the computer simulation occurs from 200 ns to 300 ns, in actual testing applications this will be more like 10 microseconds, i.e. 10,000 nsec. The 100 nsec ramp was used for simulation purposes only.) If the ramp down has occurred and an input from COUNTB occurs as at about 350 ns in conjunction with SAOUT being high, TEST MODE is activated and latched through latch gates A2 and A3. TEST MODE, COUNTB, VCOMP, and SAOUT remains high until MRESET at 500 ns.

Figure 3B:
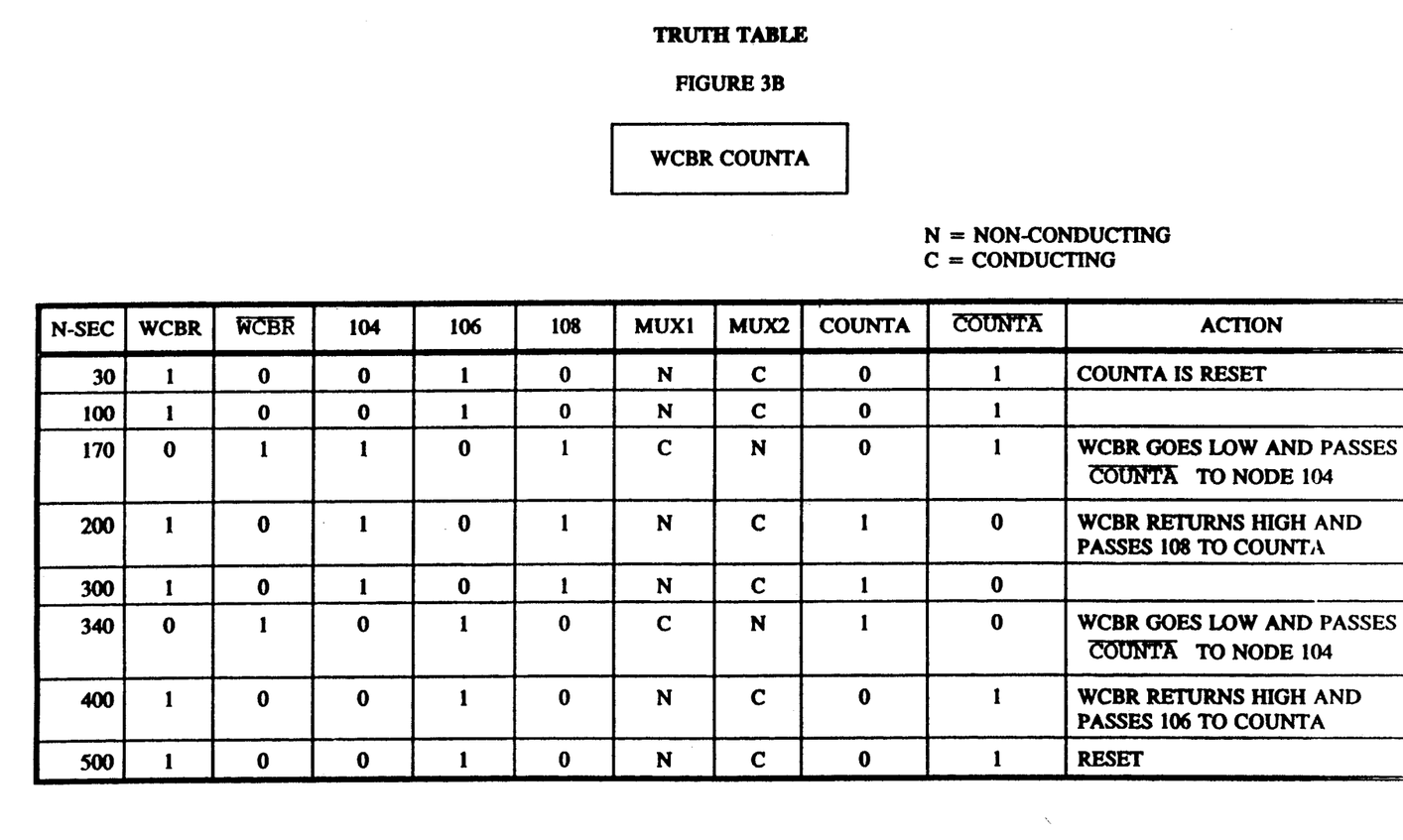

Operation of the WCBR counters can be described by referring to FIG. 1 and FIG. 3B, Table WCBR COUNTA. At 20 ns MRESET goes low and sets mode 108 to zero volts through NAND gate A1 and invertor I3. MUX2 operates so as to be conducting from input to output (108 to COUNTA) when WCBR is high (1) and $\overline{\text{WCBR}}$ is low (0). When the signals are reversed, the input to output is non-conducting.

At 20 ns, WCBR is high so that MUX2 is conducting and the zero propagates through to COUNTA resetting it to zero. When WCBR goes low at 160 ns, MUX2 is non-conducting and MUX1 becomes conducting. This passes $\overline{\text{COUNTA}}$ to node 104 switching it with nodes 106 and 108. When WCBR returns to high, the logic "1" at node 108 is passed through MUX2 to COUNTA driving it high at about 190 ns. COUNTA will transition high or low with each rising edge of transition of WCBR. It can be called a "divide-by-two circuit".

Figure 3C:
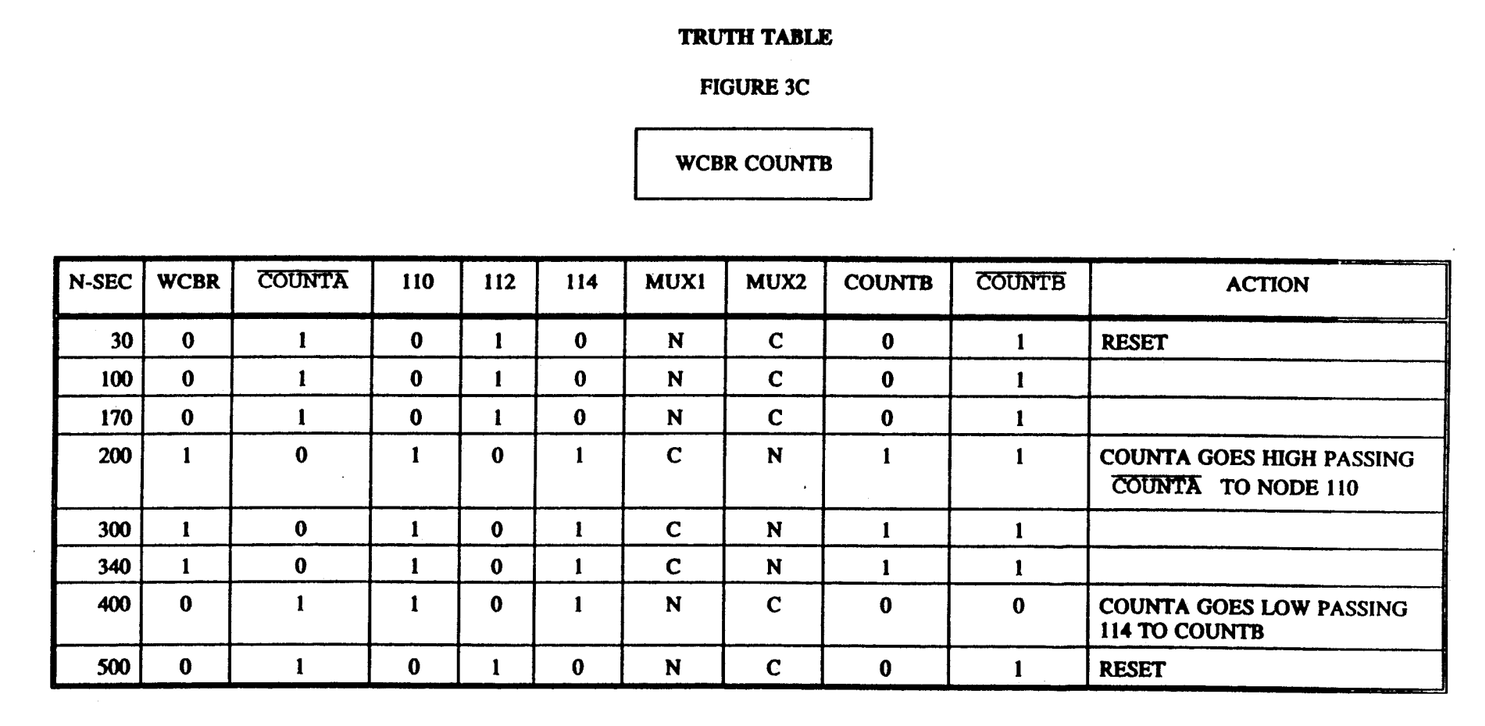

Referring now to the WCBR COUNTB circuit (FIG. 1) and Table of FIG. 3C, the output COUNTB changes from low to high as a result of inputs COUNTA and $\overline{\text{COUNTA}}$ at 350 ns in a similar manner as the WCBR COUNTA circuit which had inputs WCBR and $\overline{\text{WCBR}}$.

Figure 3D:
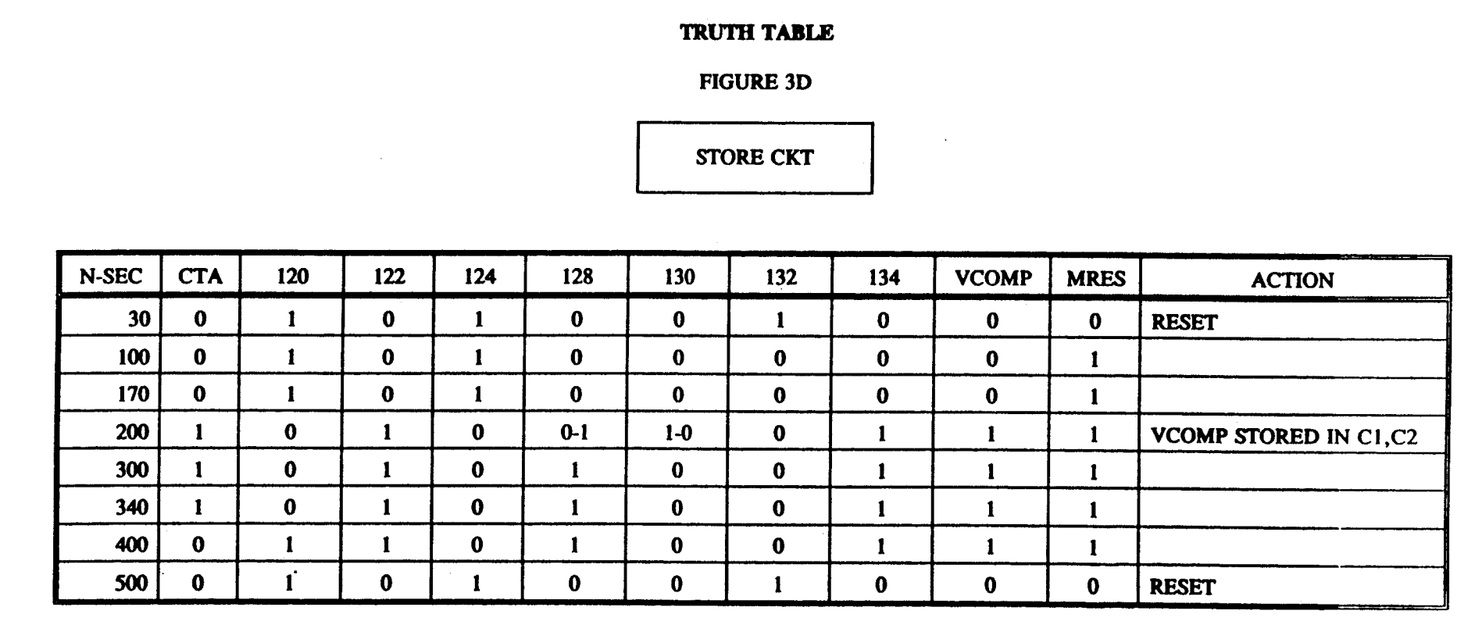

Referring to the store means 16 of FIG. 1 and FIG. 3D, a high COUNTA input at 200 ns to I1 causes a low at 120, a high at 122, and a low at 124. The delay invertors I2 through I6 cause a low at both 128 and 124 for a very short one-shot period, thereby causing NOR gate to have an output high at 130. This, in turn, causes VDD to charge up and store VDD at 134 and 5+ volts at VCOMP (across capacitor C2), due to conduction of MOS FET MN5 (an N-channel MOS device).

Figure 3E:
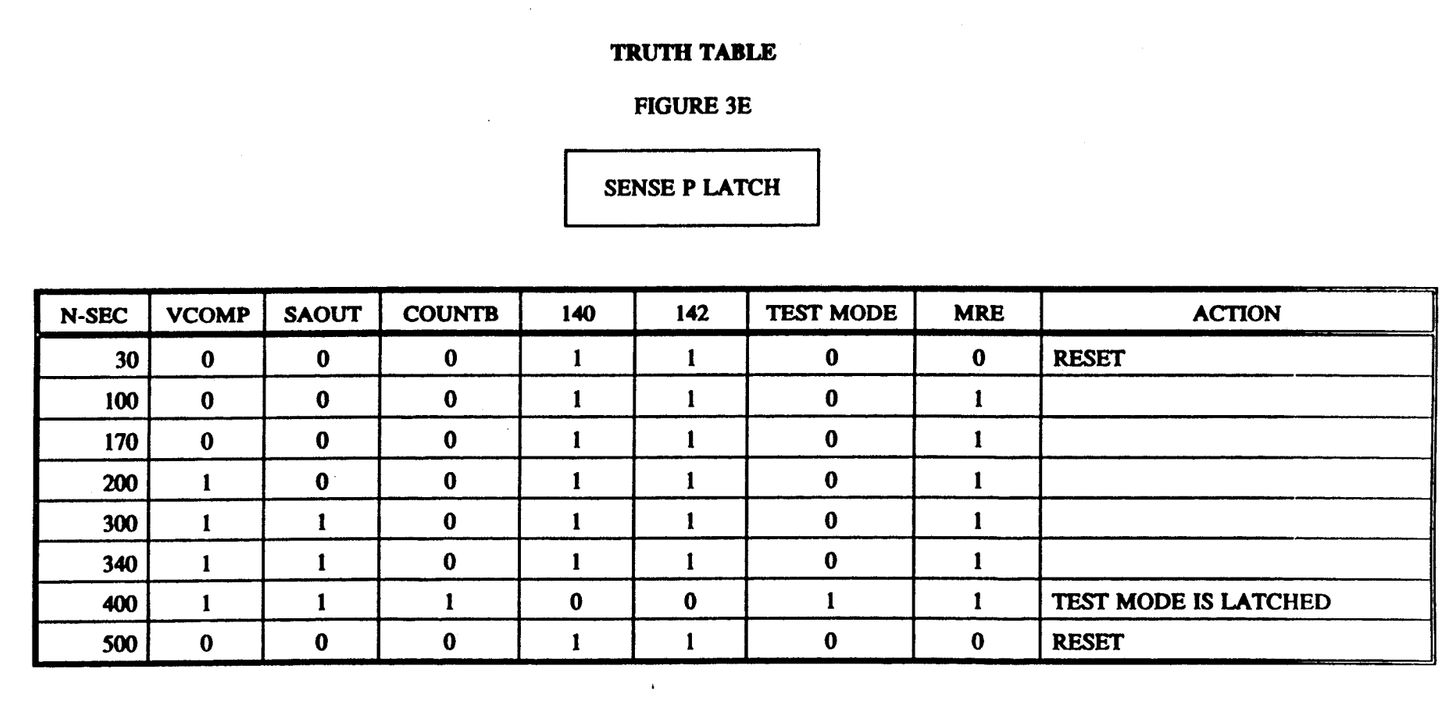

Referring now to sense means 18 and FIG. 3E, at 340 ns, a second pulse has occurred at WCBR and at this time VDD is in a low state, having been ramped down from 8 volts to 4 volts. Additionally, COUNTB is high, which in combination with a high SAOUT causes output TEST MODE to latch high. A high at SAOUT has occurred since VDD is compared to and is less than VCOMP at 5 volts. The circuits are reset at the end of testing by MRESET as at 500 ns.

While only one presently preferred embodiment has been described in detail, as will be apparent to those familiar with the art, certain changes and modifications can be made without departing from the scope of the invention as defined by the following claims.

What is claimed is:

1. In an integrated circuit memory chip, an improved test mode activation circuit having an external input voltage (VDD), an external first and second input pulse, and an external first and second reset signal (MRESET), said circuit comprising:
   a first counter means for counting the first external input pulse;
   a second counter means for counting the second external input pulse and having an input from the first counter means and having an output when the second external input pulse occurs;
   a voltage store means connected to an output from the first pulse counter means;
   a voltage sense means for comparing the input voltage VDD with the voltage store means and having an output if the external voltage is less than a voltage store means voltage signal (VCOMP); and
   a latch means having an output to cause test mode activation when the voltage sense means output occurs in conjunction with the output from the second pulse counter means.

2. The activation circuit as recited in claim 1 and wherein the first counter means further comprises a first binary ripple counter response to the first input pulse and first reset signal MRESET thereby causing a high output COUNTA from the counter.

3. The activation circuit as recited in claim 2 and wherein the second counter means further comprises a second binary ripple counter responsive to an output from the first counter means in conjunction with the second input pulse and having a high output as a response.

4. The activation circuit as recited in claim 3 and wherein the voltage store means further comprises:
   a first invertor having an input from the first binary ripple counter;
   a pair of latch gates having an input from the first invertor;
   a plurality of invertors forming a delay circuit having an input from the latch gates;
   a NOR gate having an input from the latch gates and the delay circuit, thereby having a one-shot output;
   a first MOS FET device having an input from the one-shot NOR gate and input from voltage source VDD;
   a second invertor having the input singal MRESET:
   a first and second capacitor for storing the voltage VDD from the first MOS FET device, the second capacitor storing the voltage signal VCOMP; and
   a plurality of MOS FET devices having an output from the second invertor for resetting the voltage on the capacitors to zero.

5. The activation circuit as recited in claim 4 and wherein the voltage sense means further comprises:
   a P-channel MOS FET device having input from voltage VCOMP and gate signal VDD; and
   a voltage sense means output signal (SAOUT), such that when voltage VDD is less than VCOMP the output SAOUT is high.

6. The activation circuit as recited in claim 5 and wherein the latch means further comprises:
   a first NAND gate having input signal SAOUT and the input from the second binary ripple counter COUNTB; and
   a pair of latch NAND gates having input from the first NAND gate and input signal MRESET such that if an input SAOUT occurs in conjunction with the input COUNTB from the second ripple counter, a high output TEST MODE is activated until the second MRESET signal resets all circuits.

7. The voltage store means as recited in claim 4 and hwerein the voltage VDD is reduced from about 8 volts to about 4 volts after the first external input pulse, and the stored voltage VCOMP is about 5 volts.

8. In an integrated circuit memory chip, an improved test mode activation circuit having an external input voltage (VDD), a first and second external input pulse (WCBR), and an external first and second reset signal (MRESET), said circuit comprising:
   a first binary ripple counter circuit (WCBR COUNTA) receiving the first input pulse WCBR and the first reset signal MRSET and having a first output signal (COUNTA) and a second output signal ($\overline{\text{COUNTA}}$);
   a second binary ripple counter circuit (WCBR COUNTB) receiving signals COUNTA, $\overline{\text{COUNTA}}$, and MRESET, and having an output signal;
   a voltage store circuit (STORE) receiving signals COUNTA, MRESET, and voltage VDD, and having an output voltage signal (VCOMP);
   a sense circuit receiving signal VCOMP, MRESET, and voltage VDD, and having an output signal (SAOUT);
   a latch circuit receiving signals SAOUT and (COUNTB), and having an output signal (TEST MODE), such that if the first pulse WCBR occurs when VDD is at a high state and the second pulse WCBR occurs when VDD is in a low state, an output high state occurs at TEST MODE until the MRESET pulse restores all circuits to an original state and TEST MODE returns to a low state.

9. The activation circuit as recited in claim 8 and wherein the WCBR COUNTA circuit further comprises:
   a first invertor (I1) receiving input pulse WCBR and having an output pulse $\overline{\text{WCBR}}$;
   a first multiplexer (MUX1) and a second multiplexer (MUX2) each receiving input pulses WCBR and $\overline{\text{WCBR}}$;
   a NAND gate (A1) having an input from MUX1 and an output to a second invertor (I2) and a third invertor (I3); I3 having an output to MUX2;
   a fourth invertor (I4) having as output signal COUNTA and receiving as input signal $\overline{\text{COUNTA}}$; and
   a fifth invertor (I5) having as output signal $\overline{\text{COUNTA}}$ and receiving as input signal COUNTA.

10. The activation circuit as recited in claim 8 and wherein the WCBR COUNTB circuit further comprises:
    a first multiplexer (MUX1) and a second multiplexer (MUX2) each receiving as input signals COUNTA and $\overline{\text{COUNTA}}$;

a NAND gate (A1) having an input from MUX1 and an output to a second invertor (I2) and a third invertor (I3); I3 having an output to MUX2;

an invertor I4 having as output signal $\overline{\text{COUNTB}}$ and receiving as input signal COUNTB; and a fifth invertor (I5) having as output signal COUNTB and receiving as input signal $\overline{\text{COUNTB}}$.

11. The activation circuit as recited in claim 8 and wherein the voltage store circuit further comprises:
a first invertor (I1) receiving input signal COUNTA;
a pair of NAND gates connected to perform a latching function, having inputs from I1 and the signal MRESET;
a plurality of delay invertors having an input from the pair of NAND gates;
a NOR gate having inputs from the delay invertors and the latching NAND gates; and
a voltage storing and resetting means having inputs from the NOR gate, external voltage VDD and signal MRESET.

12. The store circuit as recited in claim 11 and wherein the voltage signal stored at VCOMP for comparison with a low state of VDD is abvout 5 volts.

13. The activation circuit as recited in claim 12 and wherein a first high state voltage VDD is about 8 volts and the second low state voltage VDD is about 4 volts.

14. The activation circuit as recited in claim 8 and wherein
the output signal SAOUT fron the sense circuit occurs when voltage VDD is less than signal VCOMP.

15. The activation circuit as recited in claim 8 and wherein the latch circuit further comprises:

a NAND gate (A1) having input signals SAOUT and COUNTB;
an output to latch NAND gate (A2) and latch NAND gate (A3); and
wherein an output high state signal TEST MODE from the latch NAND gates occurs when input signal COUNTB and signal VCOMP occur simultaneously.

16. A method of activating a test mode in an integrated circuit chip having an external input voltage (VDD), and external first and second input pulse (WCBR), and an external first and second reset signal (MRESET), comprising the steps of:
resetting all circuits by the first reset signal MRESET;
providing a high level power supply input VDD;
initiating the first pulse WCBR at a first binary counter;
storing a voltage signal (VCOMP) in a storage circuit;
reducing the power supply input VDD to a low level;
initiating the second pulse WCBR at the first binary counter and a second binary counter;
comparing VCOMP with the low level VDD;
sensing a difference in the signal VCOMP and VDD;
latching an output test mode voltage to initiate a test mode; and
resetting all circuits with the second reset signal MRESET on completion of the test mode.

17. The method as recited in claim 16 and wherein:
the high level VDD is about 8 volts and the low level VDD is about 4 volts.

18. The method as recited in claim 17 and wherein the voltage signal VCOMP stored is about 5 volts.

* * * * *